(12) United States Patent
Nagao et al.

(10) Patent No.: US 7,089,656 B2
(45) Date of Patent: Aug. 15, 2006

(54) ELECTRIC PARTS MOUNTING APPARATUS

(75) Inventors: Kazuhide Nagao, Fukuoka (JP); Shigeyuki Yoshitomi, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 173 days.

(21) Appl. No.: 10/724,678

(22) Filed: Dec. 1, 2003

(65) Prior Publication Data
US 2004/0109172 A1 Jun. 10, 2004

(30) Foreign Application Priority Data
Dec. 3, 2002 (JP) ............... P. 2002-351053

(51) Int. Cl.
*B23P 19/00* (2006.01)

(52) U.S. Cl. ............... 29/740; 29/739; 29/743; 29/759

(58) Field of Classification Search ............. 29/739, 29/740, 743, 759
See application file for complete search history.

(56) References Cited

U.S. PATENT DOCUMENTS

| | | | | |
|---|---|---|---|---|
| 4,805,110 A | * | 2/1989 | Takahashi et al. | 700/121 |
| 5,084,962 A | * | 2/1992 | Takahashi et al. | 29/833 |
| 5,224,262 A | * | 7/1993 | Takaichi et al. | 29/721 |
| 5,249,356 A | * | 10/1993 | Okuda et al. | 29/833 |
| 5,379,514 A | * | 1/1995 | Okuda et al. | 29/833 |
| 5,384,956 A | * | 1/1995 | Sakurai et al. | 29/834 |
| 5,566,447 A | * | 10/1996 | Sakurai | 29/832 |
| 5,724,722 A | * | 3/1998 | Hashimoto | 29/740 |
| 5,864,944 A | * | 2/1999 | Kashiwagi et al. | 29/833 |
| 5,991,039 A | | 11/1999 | Fujishiro et al. | |
| 6,041,494 A | * | 3/2000 | Mimura et al. | 29/832 |
| 6,211,958 B1 | | 4/2001 | Hachiya et al. | |
| 6,256,869 B1 | * | 7/2001 | Asai et al. | 29/740 |
| 6,910,262 B1 | * | 6/2005 | Shimizu | 29/743 |
| 6,915,565 B1 | * | 7/2005 | Isogai et al. | 29/833 |
| 6,941,646 B1 | * | 9/2005 | Suhara | 29/740 |

FOREIGN PATENT DOCUMENTS

| | | |
|---|---|---|
| EP | 0 510 323 A1 | 10/1992 |
| JP | 8-153997 | 6/1996 |
| WO | WO 97/32180 | 9/1997 |

\* cited by examiner

*Primary Examiner*—Carl J. Arbes
(74) *Attorney, Agent, or Firm*—Pearne & Gordon LLP

(57) ABSTRACT

An electronic parts mounting apparatus which holds an electronic part with a mounting head, photographs the electronic part by a line camera 11, processes an image of the electronic part photographed by the line camera to recognize a position of the electronic part by using a recognition unit 16, positions the electronic part to a substrate in accordance with the position recognition result, and mounts the electronic part on the substrate. Offset values which are pre-stored for each recognition system associated with its own light source, a light source for transmission illumination 15a or a light source for reflection illumination 15b, are used for offset values used when a position correction is made, at the time of positioning, based on the position recognition result. Even in the electronic parts mounting apparatus of the type in which the plural recognition systems are selectively operated, the position recognition result difference caused by the use of another type of the illumination method is corrected to secure a necessary part mounting accuracy.

10 Claims, 6 Drawing Sheets

ELECTRIC PARTS MOUNTING APPARATUS

BACKGROUND OF THE INVENTION

The present invention relates to an electronic parts mounting apparatus and method which holds an electronic part with a nozzle, and transfers the thus held electronic part to a substrate and mounts the electronic part on the substrate.

In the apparatus for mounting electronic parts on a substrate, a technique for correcting a mounting position of the electronic part by use of an image recognition process is widely used to improve an accuracy of a mounting position of the electronic part on the substrate. In the technique, the transfer head picks up an electronic part from a part supply sections and holds the electronic part with the nozzle, and moves to a substrate along a path. A camera photographs the electronic part held by the head. A photographed image of the electronic part is processed to detect a position shift of the electronic part. When the electronic part is positioned to the substrate, the position shift of the electronic part has been corrected and hence, the electronic part is accurately mounted at its true position.

Techniques for recognizing positions of electronic parts by use of a camera are known. A first technique of them is that the underside of an electronic part is illuminated with light from below, and a camera receives light reflected from the electronic part to photograph an image of the electronic part. The image thus obtained is used for the position recognition. Another technique is a transmission illumination technique. In the technique, a reflecting plate is used which is located on the rearward of an electronic part. Illumination light is projected to the reflecting plate. A camera receives reflecting light from the reflecting plate. An image photographed is used for the position recognition. A further known technique uses two different recognition systems which are respectively applied to their own objects to be recognized, and are selectively used according to an object to be currently recognized. Those systems are installed in one electronic parts mounting apparatus (see for example, JP-A-08-153997<Japanese Patent Application Publication Number: Hei08-153997.>). The electronic parts mounting apparatus currently used includes different light sources. A light source is selected from those light sources according to a shape, size and surface property of an electronic part to be recognized. Thus, plural recognition systems can selectively be used.

In the electronic parts mounting apparatus of the type in which the plural recognition systems are selectively operated, the mounting position accuracy sometimes varies owing to characteristics of the recognition systems. To be more specific, also when an electronic part being in a same state is photographed by one and the same camera, the result of the position recognition based on an image of the electronic part photographed by the transmission illumination is sometimes different from the result of the position recognition based on an image of the electronic part photographed by the reflection illumination.

This recognition result difference is caused by various factors: for example, the difference between the transmission illumination system in which a silhouette of an outside shape of the electronic part is presented as an image and the reflection illumination system in which a shape of the underside of the electronic part is presented as an image, further, diffraction of the illumination light in the transmission illumination, and others. For this reason, when the part mounting work is performed by properly selecting the recognition system according to an object to be recognized in the electronic parts mounting apparatus of the type in which the plural recognition systems are selectively operated, the position recognition result difference as stated above causes the part mounting accuracy to vary.

SUMMARY OF THE INVENTION

Accordingly, an object of the present invention is to provide an electronic parts mounting apparatus and method which secures a satisfactory accuracy of parts mounting even in the electronic parts mounting apparatus of the type in which the plural recognition systems are selectively operated.

According to one aspect of the present invention, there is provided an electronic part mounting apparatus, for holding an electronic part with a nozzle, transferring the held electronic part to a substrate and mounting the electronic part on the substrate, comprising a mounting head including the nozzle; a head moving device for moving the mounting heads relative to said substrate; an image recognition device, provided on a moving path of the mounting heads, for photographing and recognizing an electronic part held with the nozzle; an illumination for illuminating the electronic part by a light source selected from plural different light sources when the electronic part is photographed; a control unit for controlling the head moving device to perform a part mounting operation in which a positioning and a mounting of the electronic part on the substrate are operated, and an offset values storage for storing offset values used when a position correction is made during the positioning, based on the recognition result of said recognition means, for each recognition system corresponding to its own light source.

According to another aspect of the invention, there is provided an electronic part mounting method, for holding an electronic part with a nozzle, transferring the held electronic part to a substrate and mounting the electronic part on the substrate comprising the steps of moving a mounting head which holds an electronic part with the nozzle relative to the substrate; photographing and recognizing the electronic part held with said nozzle by a recognition means on a moving path of the mounting head; illuminating the electronic part by a illumination means with a plurality of light sources when the electronic part is photographed in the photographing and recognizing step; and positioning the electronic part held with said mounting head to the substrate and mounting the electronic part on said substrate; wherein off set values used when a position correction is made, at the time of said positioning, based on the recognition result of said recognition means, are used for each recognition system corresponding to its own light source.

According to the present invention, the offset values which are pre-stored for each recognition system associated with its own light source are used for the offset values used when a position correction is made, at the time of part mounting operation, based on the recognition result of the recognition means. Even in the electronic parts mounting apparatus of the type in which the plural recognition systems are selectively operated, the position recognition result difference caused by the use of another type of the illumination method is corrected to secure a necessary part mounting accuracy.

Figure 1:
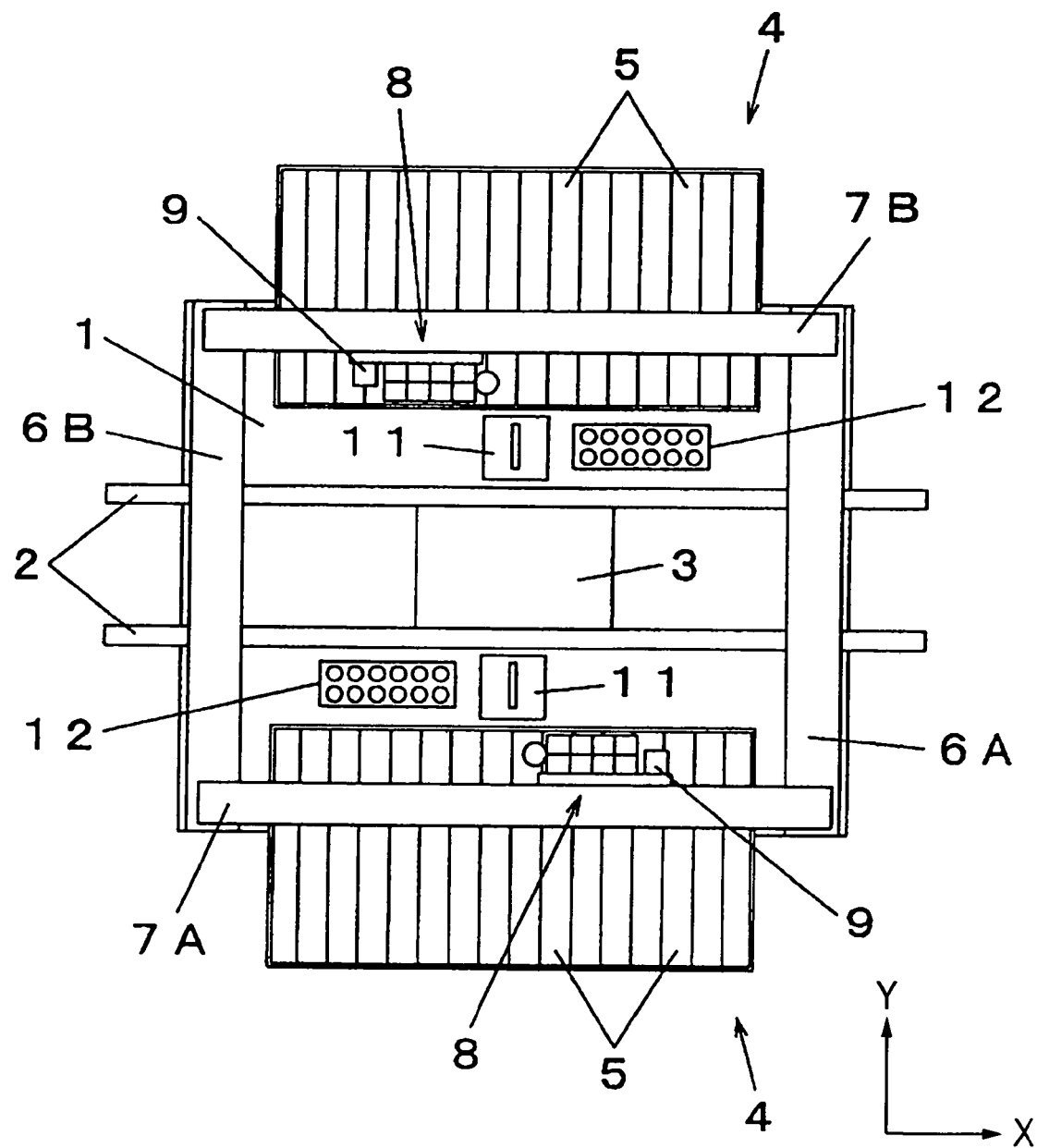
FIG. 1 is a plan view showing an electronic parts mounting apparatus which is an embodiment of the present invention.

Note that in the drawings, reference numeral 3 denotes substrate, 8 transfer head unit, 8a transfer head unit, 11 line camera, 14 absorption nozzle, 15 illumination unit, 15a light source for transmission illumination, 15b light source for reflection illumination, 16 recognition unit, 17 illumination selector, 23 mounting position offset values storage, 24 offset values storage for transmission illumination recognition and 25 offset values storage for reflection illumination recognition.

DESCRIPTION OF THE PREFERRED EMBODIMENT

Figure 2:
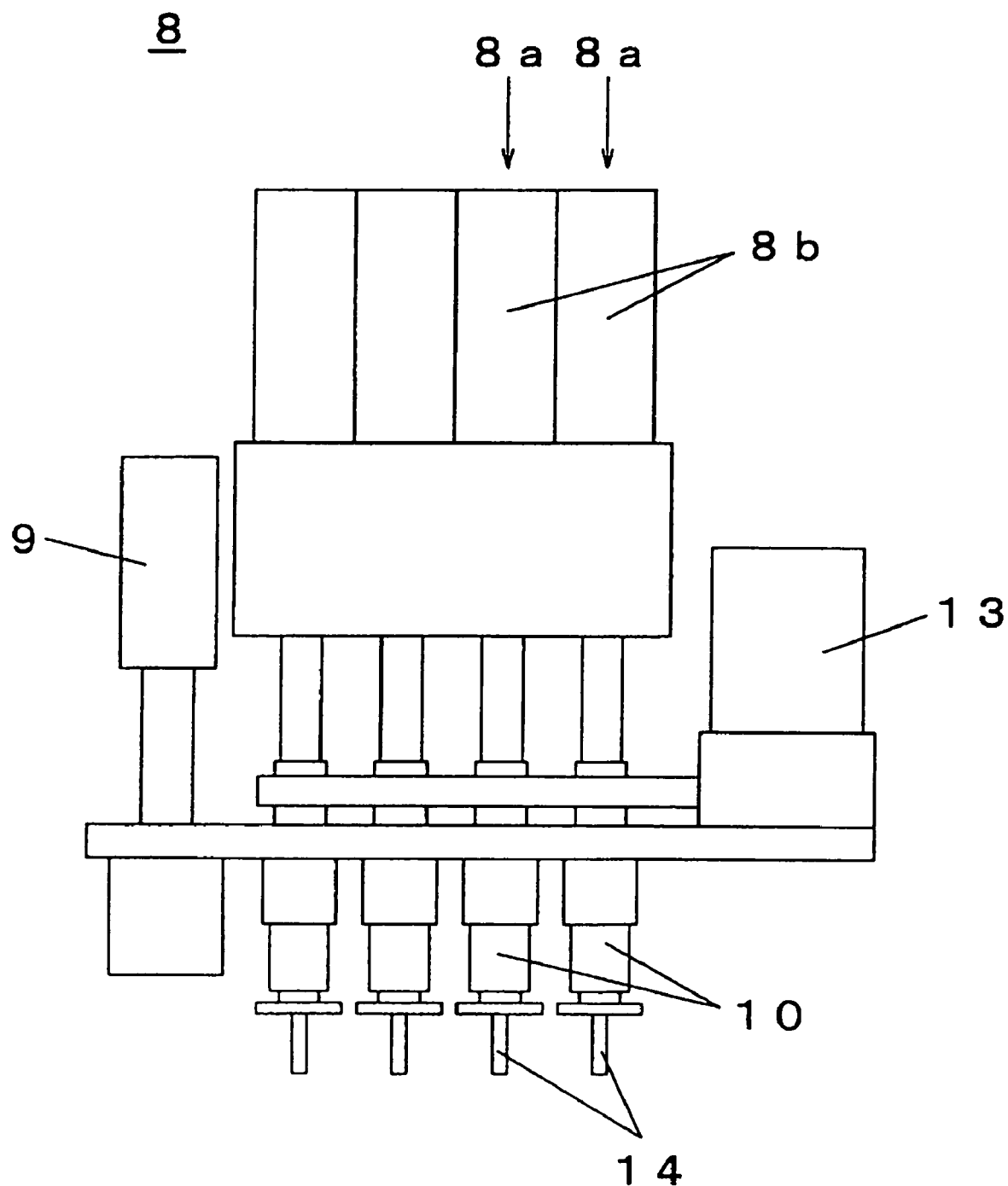
FIG. 2 is a view showing a transfer head unit of the electronic parts mounting apparatus of FIG. 1.
Figure 3:
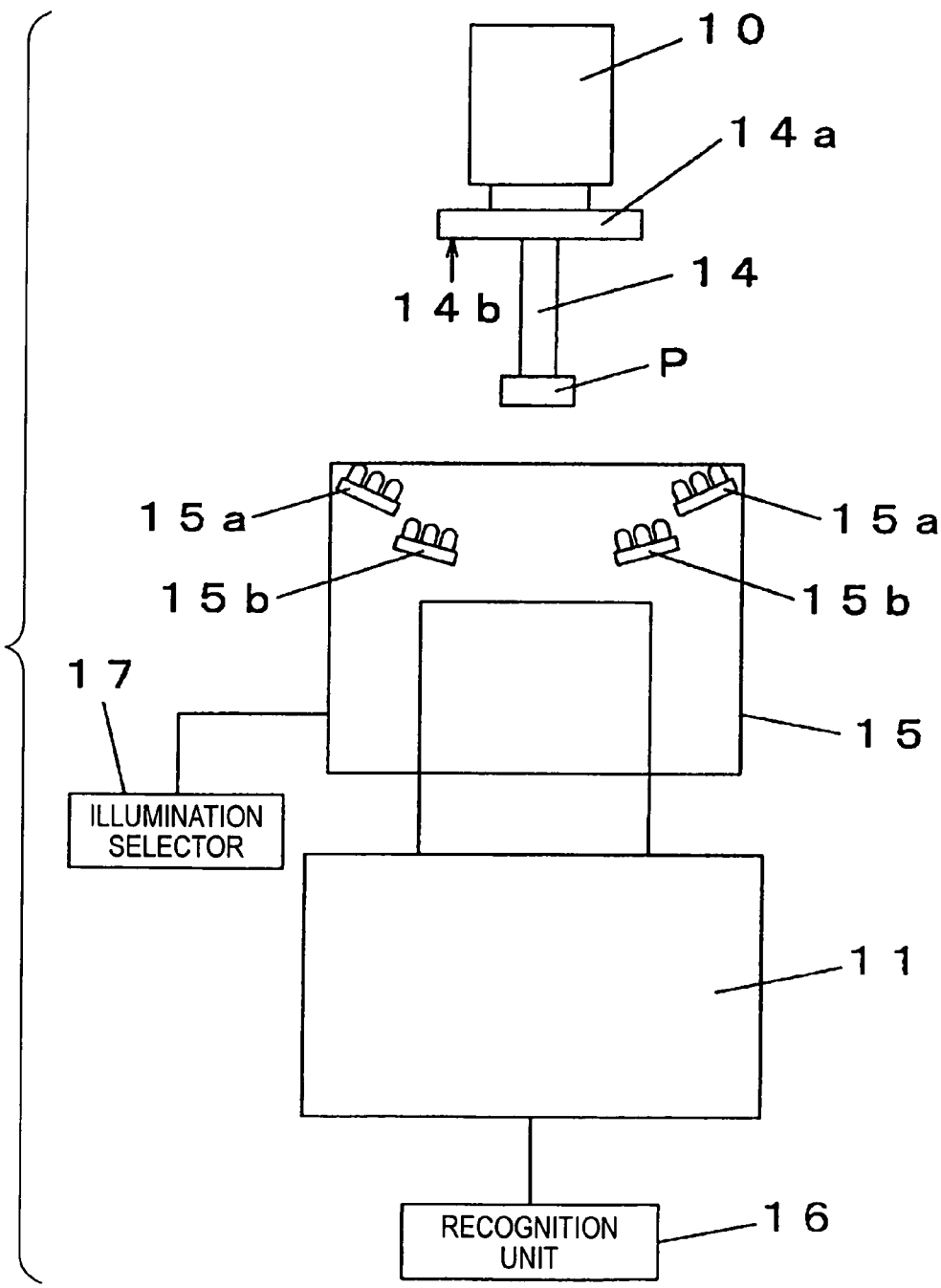
FIG. 3 is an explanatory diagram showing an image recognition device used in the electronic parts mounting apparatus of FIG. 1.
Figure 4A:
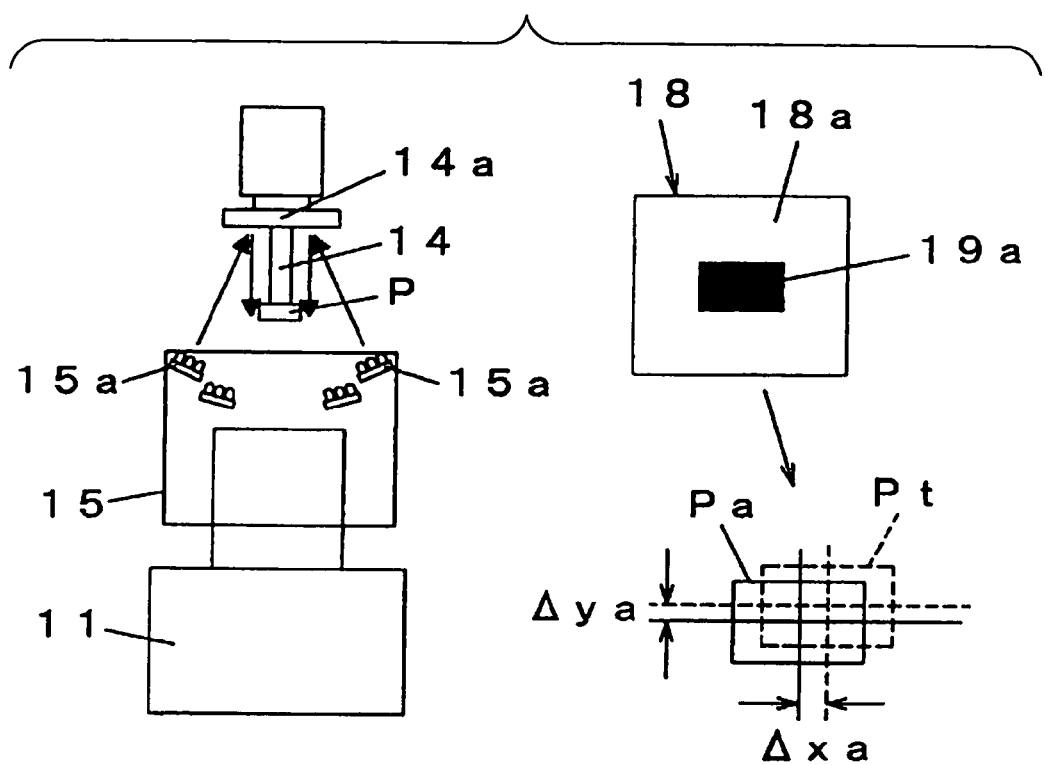
FIG. 4A and FIG. 4B are explanatory diagrams explaining a part recognition process in the electronic parts mounting apparatus of FIG. 1.
Figure 4B:
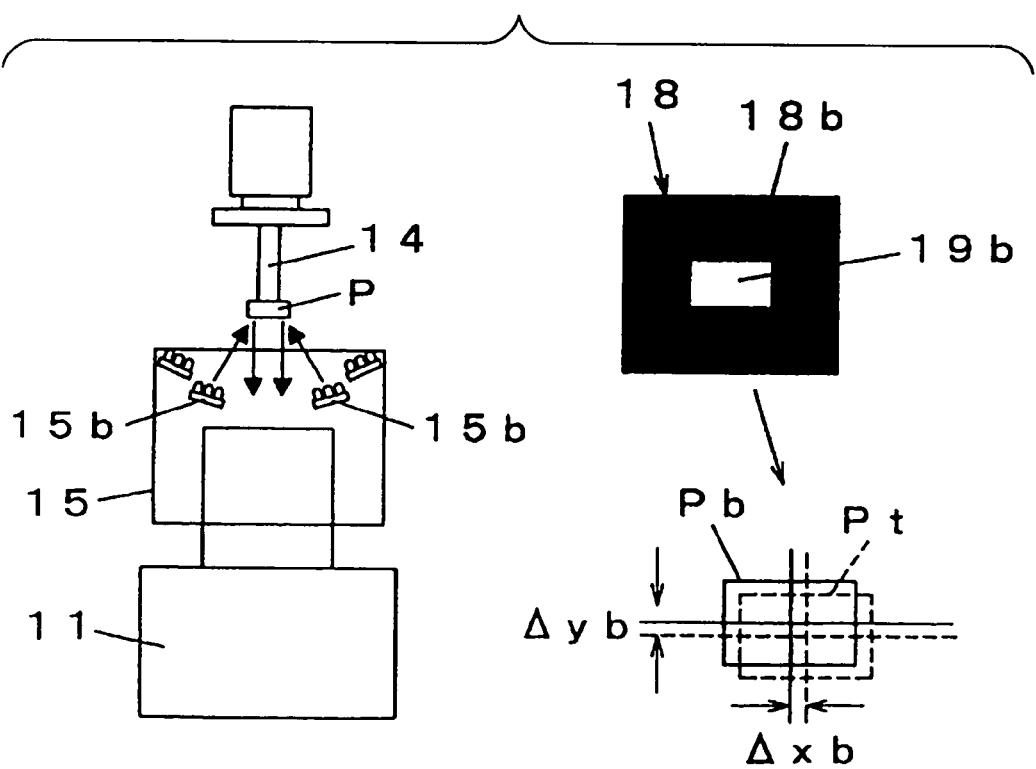
Figure 5:
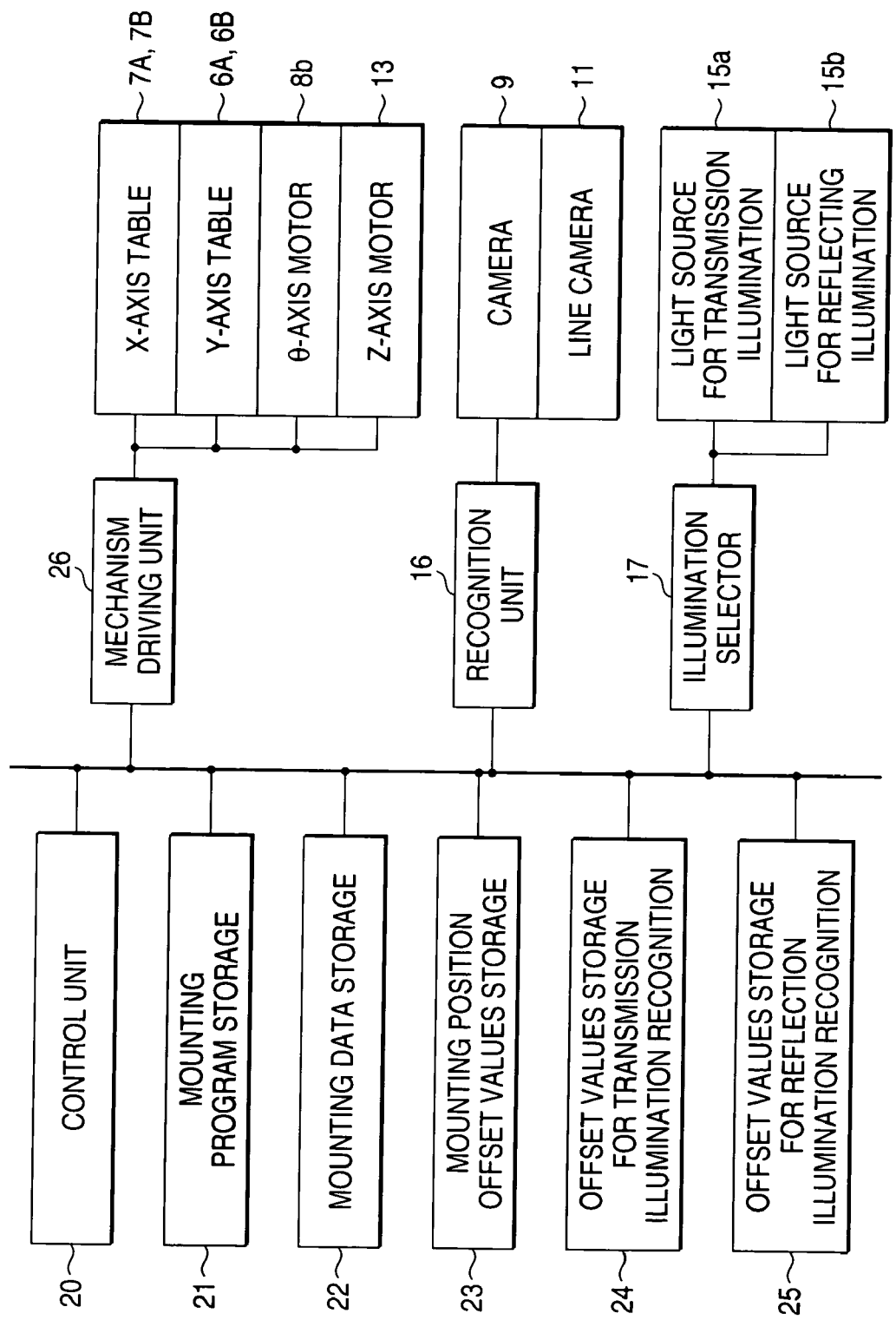
FIG. 5 is a block diagram showing a control system in the electronic parts mounting apparatus of FIG. 1.
Figure 6:
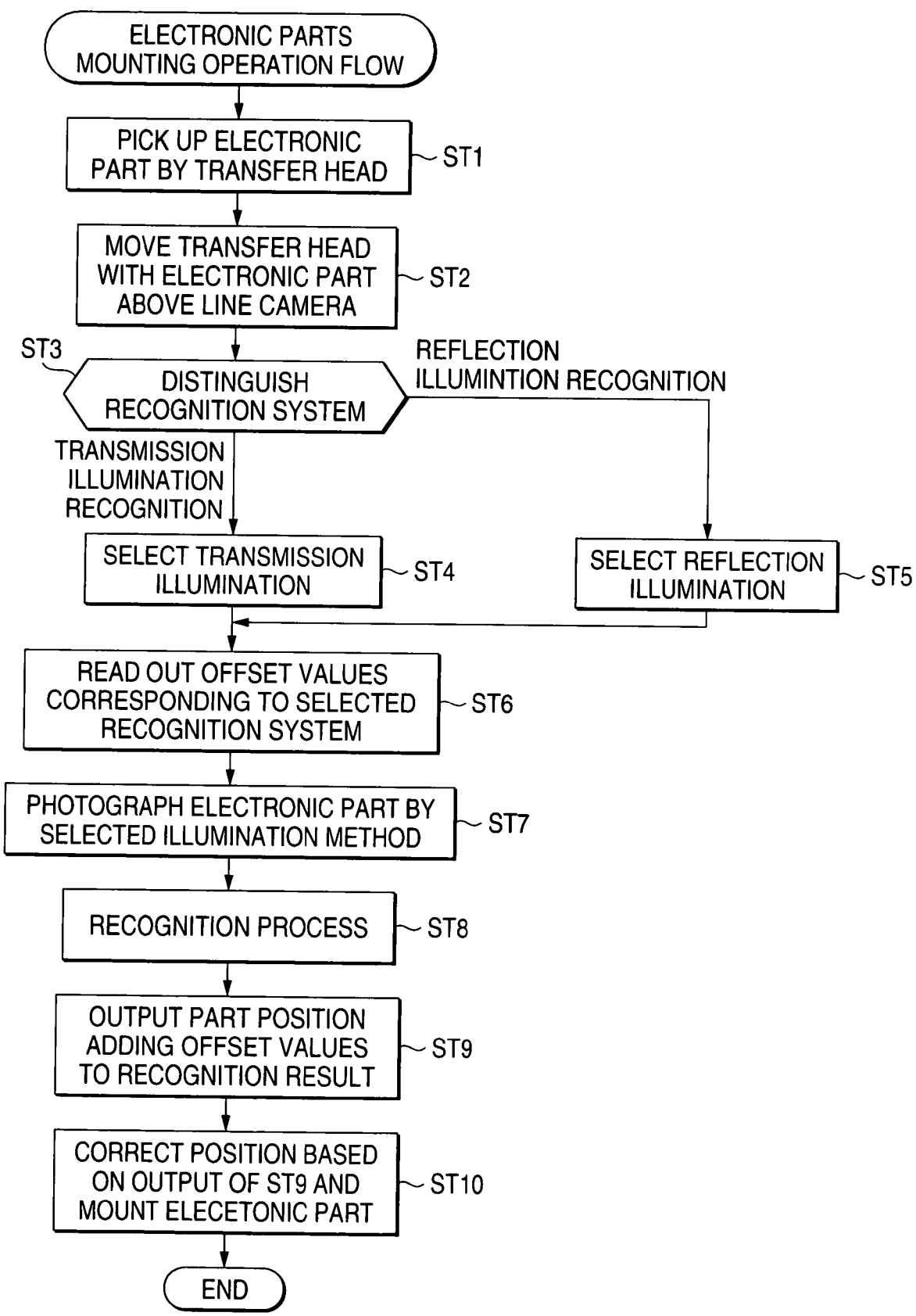
FIG. 6 is a flow chart showing a flow of electronic part mounting process by the electronic parts mounting apparatus of FIG. 1.

The preferred embodiment of the invention will be described with reference to the accompanying drawings. FIG. 1 is a plan view showing an electronic parts mounting apparatus which is an embodiment of the present invention. FIG. 2 is a view showing a transfer head unit of the electronic parts mounting apparatus of FIG. 1. FIG. 3 is an explanatory diagram showing an image recognition device used in the electronic parts mounting apparatus of FIG. 1. FIG. 4A and FIG. 4B is an explanatory diagram useful in explaining a part recognition process in the electronic parts mounting apparatus of FIG. 1. FIG. 5 is a block diagram showing a control system in the electronic parts mounting apparatus of FIG. 1. FIG. 6 is a flow chart showing a flow of electronic part mounting process by the electronic parts mounting apparatus of FIG. 1.

A structure of an electronic parts mounting apparatus will be described with reference to FIG. 1. In FIG. 1, a transport path 2 is located in a central part of a base 1 along an X direction. The transport path 2 guides a movement of a substrate 3 and positions the substrate 3 on a position where electronic parts are mounted on the substrate 3. Part supply sections 4 are located on both sides of the transport path 2. Each part supply section 4 contains a number of tape feeders 5 arranged side by side. Each tape feeder 5 includes electronic parts held by a tape. The tape is stepwise fed to supply electronic parts.

Y-axis tables 6A and 6B are located on both sides of a surface of the base 1, and X-axis tables 7A and 7B are arranged on the Y-axis tables 6A and 6B, while bridging them. When the Y-axis table 6A is driven, the X-axis table 7A horizontally moves in the X-axis table 7A. When the Y-axis table 6B is driven, the X-axis table 7B horizontally moves in the Y-direction. The X-axis tables 7A and 7B are each installed with a combination of a transfer head unit 8 and a camera 9 which moves together with the transfer head unit 8.

When the Y-axis tables 6A and 6B, and the X-axis tables 7A and 7B are appropriately combined and driven, the transfer head unit 8 moves in the horizontal direction, and an electronic part is picked up from the respective part supply section 4 with an absorption nozzle, and the electronic part is mounted on the substrate 3 positioned on the transport path 2. The camera 9 moves to and above the substrate 3 and photographs the substrate 3. The Y-axis tables 6A and 6B, and the X-axis tables 7A and 7B constitute a transfer means, that is a head moving device, for moving the transfer head unit 8 relative to the substrate 3.

A line camera 11 and a nozzle stocker 12 are located along a moving path of the transfer head unit 8 from the part supply section 4 to substrate 3 on the transport path 2. The line camera 11 constitutes an image recognition device for recognizing an electronic part, which will be described later. The line camera 11 photographs an electronic part held with the transfer head unit 8 from below. The nozzle stocker 12 contains various types of nozzles, which are adaptable for various types of electronic parts as objects to be absorbed. To replace the absorption nozzle with a new one, the transfer head unit 8 accesses the nozzle stocker 12.

The transfer head unit 8 will be described with reference to FIG. 2. As shown, the transfer head unit 8 is of the multi-type, and includes a plurality of absorption heads 8a (mounding heads) for holding electronic parts. The absorption heads 8a moves together with the camera 9. The absorption heads 8a are respectively provided with absorption nozzles 14 for absorbingly holding an electronic part.

The absorption nozzles 14 are detachably attached to nozzle holders 10 of the absorption heads 8a, respectively, and are selectively used according to a type of electronic part to be mounted. The absorption nozzles 14 are independently movable in the vertical directions when driven by Z-axis motors 8b coupled to the absorption heads 8a, respectively. Further, the absorption nozzles 14 are rotatable about θ-axes when driven by a common θ-axis motor 13.

An arrangement of an image recognition device incorporated into the electronic parts mounting apparatus will be described with reference to FIG. 3. The image recognition device is recognition means which photographs an electronic part P held with the absorption nozzle 14 from below, and recognizes a position of the electronic part P. The image recognition device is constituted by the line camera 11 as a photographing means and a recognition unit 16 for recognizing and processing the result of photographing by the line camera 11. An illumination unit 15 is disposed around an optical system of the line camera 11. The illumination unit 15 illuminates the electronic part P from below so that the electronic part P is photographed by the line camera 11. The illumination unit 15 includes two types of light sources of a light source for transmission illumination 15a and a light source for reflection illumination 15b.

The light source for transmission illumination 15a and light source for reflection illumination 15b are each formed with an annular array of a plurality of LEDs. An illumination selector 17 selects the light source for transmission illumination 15a or the light source for reflection illumination 15b. By controlling the operation of the illumination selector 17, an object to be illuminated, located above the illumination unit 15, is selectively illuminated from below in one of different illuminating directions. A disc-like reflecting plate 14a installed on the absorption nozzle 14 reflects light emitted from the light source for transmission illumination 15a in a downward direction by a reflecting surface 14b.

Two types of part recognition processes which are carried out by using the light source for transmission illumination 15a and the light source for reflection illumination 15b, will be described with reference to FIG. 4A and FIG. 4B. FIG. 4A diagrammatically shows a transmission illumination recognition technique using the light source for transmission illumination 15a. The light source for transmission illumination 15a is disposed such that light emitted from the light source for transmission illumination 15a is obliquely incident at a predetermined irradiation angle on the reflecting plate 14a located above the electronic part P. Reflecting light from the reflecting plate 14a is vertically incident on the line camera 11 from the rearward of the electronic part P.

The line camera 11 receives the incident light to photograph an image 18 of the electronic part P. In the image 18, a background area except the area of the electronic part P is a bright image 18a, and an area corresponding to the electronic part P is a dark image 19a. An outside shape Pa of the electronic part P corresponding to a contour line of the dark image 19a is extracted from the image 18, and a representative position (e.g., gravity center position) of the outside shape Pa is obtained, whereby a position of the electronic part P is detected.

A position of the outside shape Pa contains a position error proper to the transmission illumination recognition. Accordingly, an outside shape Pt which is located at a position shifted from the recognized position by characteristic offset values $\Delta xa$ and $\Delta ya$ that are previously obtained, is a true position of the electronic part P. In other words, a true position of the electronic part P is obtained by adding the offset values $\Delta xa$ and $\Delta ya$ (=offset values at the time of the transmission illumination recognition) to the position of the electronic part P, which is obtained by the transmission illumination recognition.

FIG. 4B diagrammatically shows a reflection illumination recognition technique using the light source for reflection illumination 15b. The light source for reflection illumination 15b is disposed such that light emitted from the light source for reflection illumination 15b is obliquely incident at a predetermined irradiation angle on the underside surface of the electronic part P. Reflecting light from the underside of the electronic part P is vertically incident on the line camera 11.

The line camera 11 receives the incident light to photograph an image of the electronic part P. In the image 18, a background area except the area of the electronic part P is a dark image 18b, and an area corresponding to the electronic part P is a bright image 19b. An outside shape Pb of the electronic part P corresponding to a contour line of the bright image 19b is extracted from the image 18, and a representative position of the outside shape Pb is obtained, whereby a position of the electronic part P is detected.

A position of the outside shape Pb contains a position error proper to the reflection illumination recognition. Accordingly, an outside shape Pt which is located at a position shifted from the recognized position by characteristic offset values $\Delta xb$ and $\Delta yb$ that are previously obtained, is a true position of the electronic part P. In other words, a true position of the electronic part P is obtained by adding the offset values $\Delta xb$ and $\Delta yb$ (=offset values at the time of the reflection illumination recognition) to the position of the electronic part P, which is obtained by the reflection illumination recognition.

Aforementioned two sets of offset values ($\Delta xa$ and $\Delta ya$, and $\Delta xb$ and $\Delta yb$) frequently take different values owing to characteristics of the illumination techniques. This recognition result difference is caused by various factors: for example, the difference between the transmission illumination in which a silhouette of an outside shape of the electronic part is presented as an image and the reflection illumination in which a shape of the underside of the electronic part is presented as an image, diffraction of the illumination light in the transmission illumination, and others.

Therefore, the electronic parts mounting apparatus of the present embodiment stores two sets of offset values ($\Delta xa$ and $\Delta ya$, and $\Delta xb$ and $\Delta yb$), and appropriately selects one of those sets of offset values according to the recognition system currently used. For a position correction when an electronic part is positioned to the substrate in a part mounting work, the set of offset values are added with a mounting position offset value used for correcting a position shift caused by an error inevitably contained in the mounting mechanism. The total offset value of them is used as a position correction value.

Instead of adding the mounting position offset value to the offset values (=recognition offset values) every time for the position recognition process as aforementioned, the following alternative may be used. The mounting position offset value is regarded as a parameter peculiar to each electronic parts mounting apparatus, and it is contained in the recognition offset values in advance. For achieving the position correction, the alternative needs a simple computing process of directly adding the recognition offset values to the recognition processing result.

A control system for the electronic parts mounting apparatus thus constructed will be described with reference to FIG. 5. In FIG. 5, a control unit 20 containing a CPU executes a parts mounting program, which is stored in a mounting program storage 21, by using mounting data stored in a mounting data storage 22 to thereby control parts-mounting operations. The mounting program storage 21 stores various programs necessary for executing parts mounting operations, such as a mounting sequence program.

The mounting data storage 22 stores data necessary for mounting operations, such as data representative of mounting positions of electronic parts on the substrate 3, data peculiar to electronic parts, and data necessary for mounting operations. The mounting position data contains a distinction data for indicating the recognition system to be used for recognizing positions of individual electronic parts, e.g., the transmission illumination system or the reflection illumination system.

A mounting position offset values storage 23 stores offset values (mounting position offset values) used for correcting a mounting position shift caused by a mechanism error of the mounting mechanism. An offset values storage for transmission illumination recognition 24 stores offset values $\Delta xa$ and $\Delta xy$ used when the position recognition is carried out using the transmission illumination system. An offset values storage for reflection illumination recognition 25 stores offset values $\Delta xb$ and $\Delta yb$ used when the position recognition is carried out using the reflection illumination system.

A mechanism driving unit 26 drives the X-axis tables 7A and 7B, and the Y-axis tables 6A and 6B, and the Z-axis motors 8b and θ-axis motor 13 of the absorption heads 8a. The recognition unit 16 recognizes a position of the substrate 3 by processing image data gathered through the photographing operation by the camera 9, and further a position of an electronic part held with the absorption nozzle 14 by processing image data gathered through the photographing operation by the line camera 11. An illumination selector 17 selects the light source for transmission illumination 15a or the light source for reflection illumination 15b. The light source selection is performed according to the data for indicating the position recognition system, which is contained in the mounting data.

The control unit 20, which forms control means, controls the mounting mechanism containing the X-axis tables 7A and 7B, the Y-axis tables 6A and 6B, the Z-axis motors 8b and the θ-axis motor 13, through the mechanism driving unit 26, whereby the electronic part held with the absorption head 8a is positioned to the substrate and mounted on the substrate. The offset values storage for transmission illumination recognition 24 and the offset values storage for reflection illumination recognition 25 constitute off set values storing means for storing offset values used when a position correction is made, at the time of positioning, based on the recognition result of the recognition means, for each recognition system associated with its own light source.

An electronic parts mounting method which is carried out by using the electronic parts mounting apparatus thus constructed will be described below referring to a flow chart shown in FIG. 6. Before the parts mounting operation starts, a mounting data about the substrate 3, to which an electronic part is to be mounted, is read from the mounting data storage 22. When the mounting operation starts, the control unit causes the transfer head unit 8 to move to the part supply sections 4, and causes the absorption heads 8a of the transfer head unit 8 to absorbingly pick up an electronic part (ST1). Then, the control unit causes the transfer head unit 8 holding the picked up electronic part to move to above the line camera 11 (ST2).

The control unit distinguishes a recognition system for recognizing the electronic part held by the transfer head unit 8 on the basis of the readout mounting data (ST3). Specifically, the control unit distinguishes whether the recognition system used for recognizing a position of the electronic part is the transmission illumination recognition system or the reflection illumination recognition system, and then selects an illumination method corresponding to the recognition system selected. When the selected recognition system is a transmission illumination recognition system, the control unit selects a transmission illumination method (ST4) When the selected recognition system is a reflection illumination recognition system, the control unit selects a reflection illumination method (ST5). And, the control unit instructs the illumination selector 17 to select the illumination method corresponding to the selected recognition system. Then, the control unit reads out the offset values (recognition offset values) corresponding to the selected recognition system (ST6). Specifically, the control unit reads out the offset values $\Delta xa$ and $\Delta ya$ from the offset values storage for transmission illumination recognition 24 or the offset values $\Delta xb$ and $\Delta yb$ from the offset values storage for reflection illumination recognition 25.

Thereafter, the electronic part is photographed. Specifically, the line camera 11 photographs the electronic part by the selected illumination method (ST7). Then, the recognition unit 16 recognition processes an image photographed (ST8). The control unit adds the offset values to the result of the recognition processing, and outputs the result of the addition as a part position (ST9). In this way, the control unit outputs a correct or true part position which does not contain a position error of the recognition processing result which results from the use of a different recognition method (see FIG. 4A and FIG. 4B).

Subsequently, the transfer head unit 8 moves to above the substrate 3, and its absorption heads 8a descend to the substrate 3 and mounts the electronic part on the substrate 3. In this case, a position of the electronic part is corrected based on the true part position as is output, and then the electronic part is mounted at the correct position (ST10). In a case where there is the necessity of correcting the error peculiar to the mounting mechanism, the total offset value which is the sum of the offset values and the mounting position offset value is used as an actual position correction value.

Thus, the electronic parts mounting method comprises: a step of moving the absorption heads 8a which holds the electronic part P with the absorption nozzle 14 relative to the substrate 3; a step of photographing the electronic part P held with the absorption nozzle 14 on the moving path of the absorption heads 8a and recognizing an image photographed by the recognition unit 16; and a step of positioning the electronic part P held with the absorption head 8a to the substrate 3, and mounting the electronic part on the substrate.

The offset values which are pre-stored for each recognition system associated with its own light source, the light source for transmission illumination 15a or the light source for reflection illumination 15b, are used for the offset values used when a position correction is made, at the time of positioning, based on the recognition result of the recognition unit 16.

Therefore, also when the part mounting work is performed by properly selecting the recognition system according to an object to be recognized in the electronic parts mounting apparatus of the type in which the plural recognition systems are selectively operated, there is no chance that the position recognition result difference causes the part mounting accuracy to vary.

The offset values which are pre-stored for each recognition system associated with its own light source are used for the offset values used when a position correction is made, at the time of part mounting operation, based on the recognition result of the recognition means. Even in the electronic parts mounting apparatus of the type in which the plural recognition systems are selectively operated, the position recognition result difference caused by the use of another type of the illumination method is corrected to secure a necessary part mounting accuracy.

What is claimed is:

1. An electronic part mounting apparatus, for holding an electronic part with a nozzle, transferring the held electronic part to a substrate and mounting the electronic part on the substrate, comprising:
    a mounting head including the nozzle;
    a head moving device for moving the mounting head relative to said substrate;
    an image recognition device, provided on a moving path of the mounting heads, for photographing and recognizing an electronic part held with the nozzle;
    an illumination for illuminating the electronic part by a light source selected from plural different light sources when the electronic part is photographed;
    a control unit for controlling the head moving device to perform a part mounting operation in which a positioning and a mounting of the electronic part on the substrate are operated, and
    an offset values storage for storing offset values used when a position correction is made during the positioning, based on the recognition result of said recognition means, for each recognition system corresponding to its own light source.

2. An electronic part mounting apparatus according to claim 1, wherein the illumination includes;
    a light source for a transmission illumination in which a silhouette of an outside shape of the electronic part is presented as an image, and
    a light source for a reflection illumination in which a shape of the underside of the electronic part is presented as an image.

3. An electronic part mounting apparatus according to claim 2, further comprising a mounting data storage for storing a distinction data for indicating the recognition system, selected from one of transmission illumination recognition system and the reflection illumination recognition system, to be used for recognizing positions of individual electronic parts.

4. An electronic part mounting apparatus according to claim 3, further comprising a illumination selector for selecting the transmission illumination or the reflection illumination according to the distinction data of the mounting data storage.

5. An electronic part mounting apparatus according to claim 4,
wherein the offset values storage comprising:
an offset values storage for transmission illumination recognition, for storing offset values used for the transmission illumination recognition, and
an offset values storage for reflection illumination recognition, for storing offset values used for the reflection illumination recognition.

6. An electronic part mounting apparatus, for holding an electronic part with a nozzle, transferring the held electronic part to a substrate and mounting the electronic part on the substrate, comprising:
a mounting head including the nozzle;
a head moving means for moving the mounting head relative to said substrate;
a recognition means, provided on a moving path of the mounting heads, for photographing and recognizing an electronic part held with the nozzle;
an illumination means for illuminating the electronic part by a light source selected from plural different light sources when the electronic part is photographed;
a control means for controlling the head moving means and controlling a part mounting operation in which a positioning and a mounting of the electronic part on the substrate are operated, and
an offset values storing means for storing offset values used when a position correction is made, at the time of said positioning, based on the recognition result of said recognition means, for each recognition system corresponding to its own light source.

7. An electronic part mounting apparatus according to claim 1, wherein the illumination means includes;
a light source for a transmission illumination in which a silhouette of an outside shape of the electronic part is presented as an image, and
a light source for a reflection illumination in which a shape of the underside of the electronic part is presented as an image.

8. An electronic part mounting apparatus according to claim 7, further comprising a mounting data storage for storing a distinction data for indicating the recognition system, selected from one of transmission illumination recognition system and the reflection illumination recognition system, to be used for recognizing positions of individual electronic parts.

9. An electronic part mounting apparatus according to claim 3, further comprising a illumination selector for selecting the transmission illumination or the reflection illumination according to the distinction data of the mounting data storage.

10. An electronic part mounting apparatus according to claim 4,
wherein the offset values storing means comprising:
an offset values storage for transmission illumination recognition, for storing offset values used for the transmission illumination recognition, and
an offset values storage for reflection illumination recognition, for storing offset values used for the reflection illumination recognition.

* * * * *